(12) United States Patent
Chen et al.

(10) Patent No.: US 8,581,307 B1
(45) Date of Patent: Nov. 12, 2013

(54) LARGE CMOS IMAGE SENSOR PIXEL WITH IMPROVED PERFORMANCE

(75) Inventors: Gang Chen, San Jose, CA (US); Duli Mao, Sunnyvale, CA (US); Hsin-Chih Tai, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 24 days.

(21) Appl. No.: 13/543,592

(22) Filed: Jul. 6, 2012

(51) Int. Cl.
*H01L 27/148* (2006.01)

(52) U.S. Cl.
USPC ............. 257/231; 257/58; 257/222; 257/225; 257/232; 257/258; 257/291; 257/440; 257/E31.097; 257/E27.133; 257/E27.135; 257/E27.138

(58) Field of Classification Search
USPC ........... 257/231, 58, 222, 225, 232, 258, 291, 257/440, E31.097, E27.133, E27.135, 257/E27.138
See application file for complete search history.

(56) References Cited

U.S. PATENT DOCUMENTS

| | | | | |
|---|---|---|---|---|
| 8,207,561 B2 * | 6/2012 | Koizumi et al. | ............... | 257/291 |
| 2007/0023796 A1 * | 2/2007 | Adkisson et al. | ............. | 257/290 |

OTHER PUBLICATIONS

Burkey, B. C., et al., "The Pinned Photodiode for an Interline-Transfer CCD Image Sensor," Research Laboratories, Eastman Kodak Company, Rochester, New York 14650, IEDM 84, pp. 28-31, © 1984 IEDM.

* cited by examiner

*Primary Examiner* — Timor Karimy
(74) *Attorney, Agent, or Firm* — Blakely Sokoloff Taylor & Zafman LLP

(57) ABSTRACT

An image sensor pixel includes a photosensitive element having a first doping type disposed in semiconductor material. A deep extension having the first doping type is disposed beneath and overlapping the photosensitive element in the semiconductor material. A floating diffusion is disposed in the semiconductor material. A transfer gate is disposed over a gate oxide that is disposed over the semiconductor material. The transfer gate is disposed between the photosensitive element and the floating diffusion. The photosensitive element and the deep extension are stacked in the semiconductor material in a "U" shape extending from under the transfer gate.

21 Claims, 5 Drawing Sheets

LARGE CMOS IMAGE SENSOR PIXEL WITH IMPROVED PERFORMANCE

BACKGROUND INFORMATION

1. Field of the Disclosure

The present invention relates generally to imaging. More specifically, examples of the present invention are related to complementary metal oxide semiconductor based image sensors.

2. Background

Image sensors have become ubiquitous. They are widely used in digital still cameras, cellular phones, security cameras, as well as, medical, automobile, and other applications. The technology used to manufacture image sensors, and in particular, complementary metal-oxide-semiconductor (CMOS) image sensors (CIS), has continued to advance at a great pace. For example, the demands for higher resolution and lower power consumption have encouraged the further miniaturization and integration of these image sensors.

Two fields of applications in which size and image quality are particularly important are security and automotive applications. For these applications the image sensor chip must typically provide a high quality image and have improved sensitivity in the near infrared portion of the light spectrum. In order to achieve these characteristics, the photosensitive apertures should be as large as possible and have very deep photodiode regions to collect more near infrared light.

The pixel (i.e., picture element) fill factor denotes the fraction of the surface area of a pixel that is sensitive to light. Pixel pitch is the physical distance between adjacent pixels in an imaging device. Pixel fill factor has become smaller as pixel pitch has been reduced because the active circuit elements and metal interconnects consume an increasing proportion of the area in each pixel as the photosensitive regions of pixels are reduced in size.

One way to address the loss of pixel fill factor is to use a microscale lens (i.e., microlens) directly above the photosensitive portion of each pixel to focus the light directly towards the photosensitive portion of the area within the pixel. Another way to address the loss of pixel fill factor is to use backside illuminated (BSI) image sensors, which place the active pixel circuit elements and metal interconnects on a frontside of an image sensor die and the photosensitive element within the substrate facing a backside of an image sensor die.

One of the transistors included in a pixel is commonly referred to as a transfer transistor, which includes a transfer gate disposed between the photosensitive element and the floating diffusion of a pixel. The transfer gate is disposed on a gate oxide. The photosensitive element, floating diffusion region, and gate oxide are disposed on a substrate.

During operation, a conducting channel region may be formed under the transfer gate when a bias voltage is applied to the transfer gate such that charge is transferred from the photosensitive element to the floating diffusion region of the pixel. A degraded image may result from the conventional pixel structure being unable to remove all of the charge from the photosensitive element such that a residual signal remains during successive readings of the pixel. This leftover information remaining in the photosensitive element, which degrades image quality, is often referred to as image lag, residual image, ghosting or frame to frame retention. In order to maximize the image quality derived from ever smaller pixels, much attention has been paid to improving carrier transfer out of the photodiode by optimizing the details of the transfer gate structure and its proximity to the photodiode.

In addition, maximizing the number of carriers that a photodiode can hold, which may also be referred to as full well capacity, as well as maximizing charge to voltage conversion when reading signals from pixels have been a focus as efforts to miniaturize image sensors have continued. Photodiodes of decreasing size have also been optimized to have greater spectral sensitivity to compensate for their reduced collection areas. For example, small photodiodes that are doped very deeply into the substrate have been developed to improve red and infra red sensitivity.

As pixel dimensions become smaller, the background current may become a larger fraction of the total signal, which reduces the signal to noise S/N ratio and dynamic range (DNR). For some applications, the loss of DNR and attendant image quality degradation has reversed the drive to miniaturize at least the photodiode element of an image sensor in order to increase the number of available signal carriers for applications involving low light, high contrast scenes, or long wavelength light. With increased distances between the outer reaches of the photodiode and the transfer gate there may be reduced lateral electric fields driving the signal carriers toward the transfer gate. With signal carriers then depending more on diffusion for their transfer out of the photodiode, more signal carriers may be left behind and result in image lag. For larger photodiodes, it becomes even more important to more fully extract signal carriers to reduce image lag.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
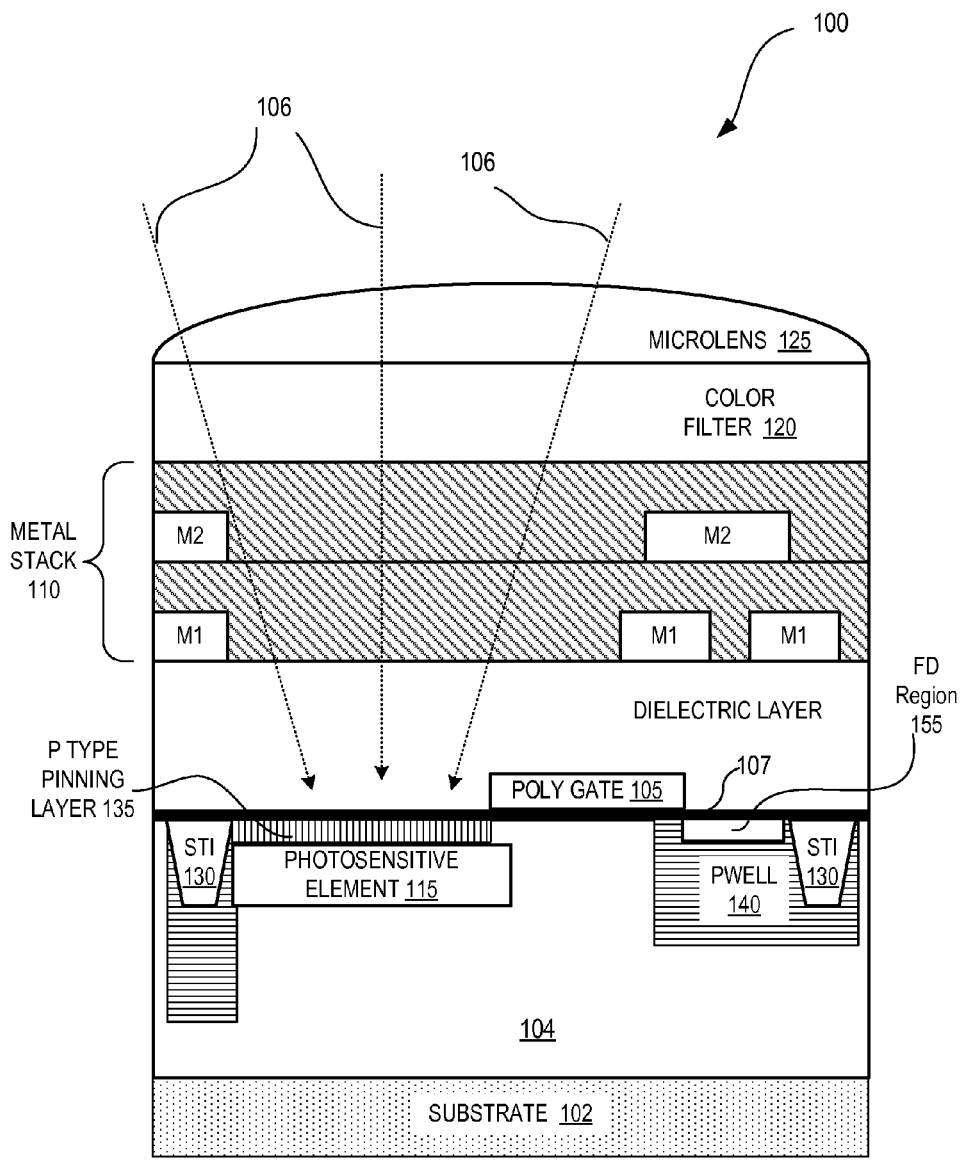
FIG. 1 is a cross-sectional view of a conventional image sensor pixel.

Corresponding reference characters indicate corresponding components throughout the several views of the drawings Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus including a CMOS image sensor with example pixel designs featuring large photodiodes that may have increased sensitivity with reduced image lag are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment," an embodiment, "one example," or "an example" means that a particular feature, structure, or characteristic described in connection with the embodiment or example is included in at least one embodiment or example of the present invention. Thus, the appearances of the phrases such as "in one embodiment" or "in one example" in various places throughout this specification are not necessarily all referring to the same embodiment or example. Furthermore, the particular features, structures, or characteristics may be combined in any suitable manner in one or more embodiments or examples.

The following is a detailed description of the terms and elements used in the description of examples of the present invention by referring to the accompanying drawings.

Conventionally known as an image sensor used for a solid-state image pickup apparatus is a Complementary Metal Oxide Semiconductor (CMOS) image sensor. A typical CMOS image sensor (CIS) pixel operates as follows. Light is incident on a microlens, which focuses the light to a photosensitive element through a filter. The photosensitive element detects the light and converts the light into an electrical signal proportional to the intensity of the light detected. The transfer gate transfers the electrical signal from the photosensitive element to the floating diffusion region.

FIG. 1 illustrates a cross-sectional view of a conventional image sensor pixel 100 of a frontside illuminated CIS including a conventional transfer gate structure. A metal stack 110 includes metal layers (e.g., metal layer M1 and M2), which are patterned in such a manner over a dielectric layer, which is disposed over the gate oxide 107 and the poly gate 105 as shown so as to create an optical path through which light 106 incident on pixel 100 can reach photosensitive or photodiode (PD) element 115. To implement a color CIS, pixel 100 further includes a color filter layer 120 disposed along the optical path of light 106. In one example, color filter layer 120 is disposed under microlens 125. Microlens 125 aids in focusing light 106 onto photosensitive element 115. An image sensor includes several image sensor pixels 100 arranged in an array of two dimensional rows and columns in a larger substrate (i.e., extending beyond substrate 102 as shown).

Referring back to FIG. 1, pixel 100 further includes a floating diffusion (FD) region 155 disposed in a P type doped well 140 on epitaxial layer 104. As shown in FIG. 1, epitaxial layer 104 is disposed on substrate 102. Shallow trench isolation (STI) 130 also is disposed in or on epitaxial layer 104. A transfer transistor having a transfer poly gate 105 is disposed between photosensitive element 115 and FD region 155, and is used to transfer the signal output from photosensitive element 115 to floating diffusion region 155. A conducting channel may be formed under the transfer gate, poly gate 105, when a bias voltage is applied to it. The bias voltage at which the channel forms may be called the Gate Threshold Voltage (Vt). A p-type pinning region 135 covers the pixel photosensitive area extending to the STI 130 insulating boundaries and the edge of the transfer poly gate 105 electrode.

Pixel 100 operates as follows. During an integration period, which may also referred to as an exposure or accumulation period, light 106 is incident on photosensitive element 115. Photosensitive element 115 generates an electrical signal in response to the incident light 106. The electric signal is held in photosensitive element 115. At this stage, the transfer transistor may be turned off. In one example, the bias voltage on poly gate 105 may be a negative voltage.

When the bias voltage on poly gate 105 is less than its threshold voltage, the channel under the poly gate 105 effectively becomes resistant to charge flow. An energy barrier is created that tends to hinder charge motion from photosensitive element 115 to floating diffusion region 155.

After the integration period, poly gate 105 is turned on to read out photosensitive element 115. In one example, a positive bias voltage may be applied to poly gate 105. When the bias on poly gate 105 is increased, the channel under the poly gate near FD region 155 becomes conductive first. The channel may continue to gradually become conductive toward photosensitive element 115 as the bias on poly gate 105 is increased and the threshold voltage is approached. The potential in the channel region under the poly gate 105 is dependent on the doping concentration at each point within the channel region. In a conventional transfer gate channel doping structure, the potential gradually decreases from photosensitive element 115 toward FD region 155, thereby generating a lateral electric field that aids the transfer of charge from the photosensitive element 115 the floating diffusion FD region 155. After the electrical signal in photosensitive element 115 has been transferred to FD region 155, poly gate 105 is turned off for the start of a subsequent integration period. Prior to the start of a subsequent integration period both the photosensitive element and the FD may be set to an initial state, or Reset, after most of the remaining signal carriers in photosensitive element 115 have been removed.

In a conventional CIS pixel that has been optimized for resolution at the expense of signal capacity, the photosensitive element lateral dimensions may range from 0.9 to 6 micrometers. The photosensitive element vertical doping profile for these pixels may range from 0.5 to 3 microns. Pixels with these small dimensions may facilitate the fabrication of CIS image sensors with resolutions from 5 million to 20 million pixels in an imaging array. In such small pixels, the center of the pixel is relatively close to the edge of the transfer gate transistor and naturally occurring lateral fields may facilitate the complete transfer of signal carriers from the entire photosensitive element region.

A conventional CIS pixel that has been optimized for infrared radiation (i.e., deep photosensitive element doping profile) and signal capacity (i.e., larger photosensitive element area) however may suffer from image lag. This problem arises because a conventional CIS pixel may have a three dimensional doping profile in which some residual signal charge may be prevented from being transferred from the photosensitive element. For instance, these pixels may have photosensitive elements whose lateral dimensions range from 3 to 10 microns. The photosensitive element vertical doping profile for these pixels may range from 1.5 to 2.5 microns. Further, such photosensitive elements may not be completely emptied between successive readings. As a consequence, some of the information from the previous light signal may remain in the photosensitive element, having not been transferred to the floating diffusion. The leftover information may be termed image lag, residual image, ghosting, frame to frame retention, etc.

Figure 2:
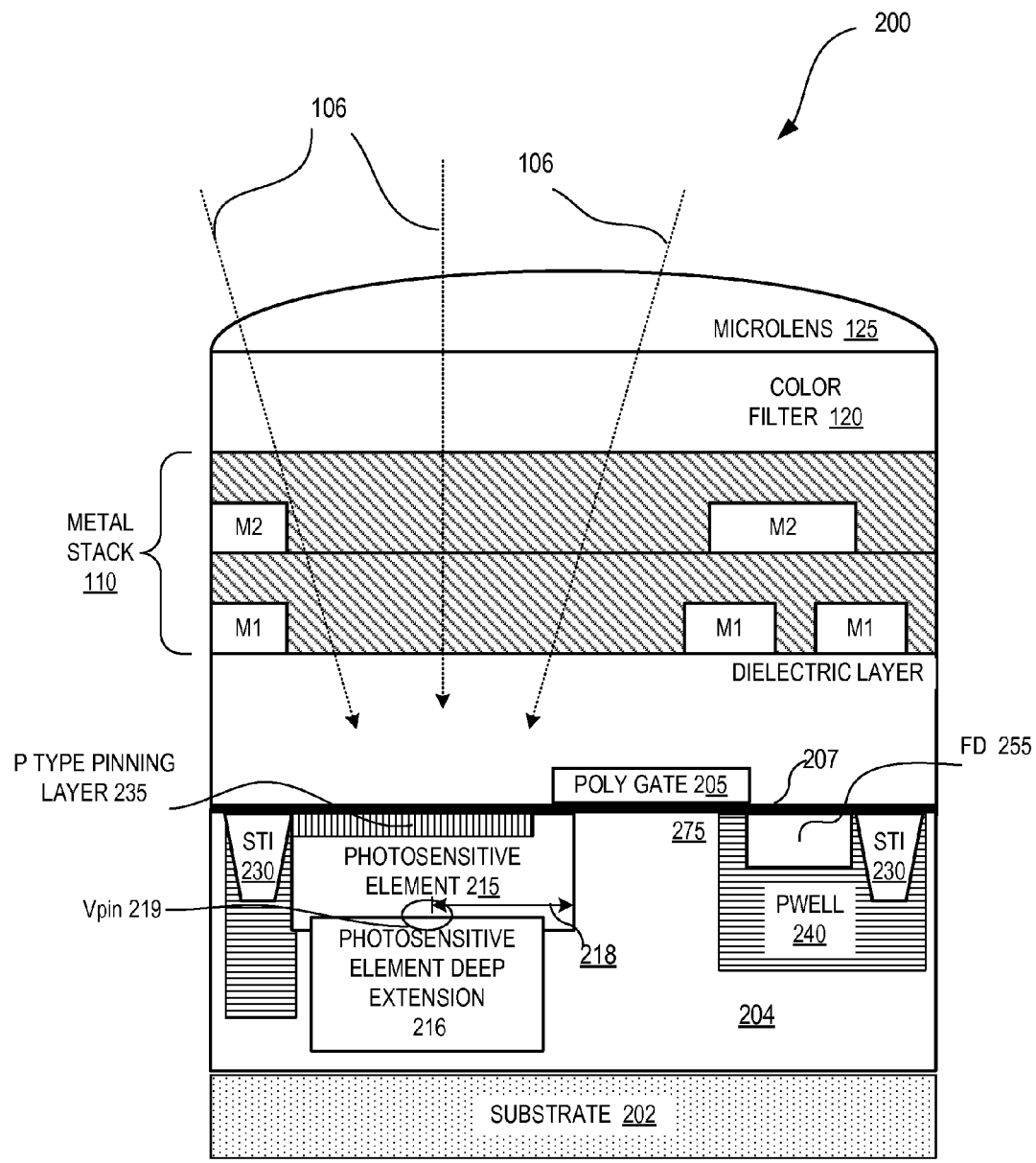
FIG. 2 is a cross-sectional view of a conventional image sensor pixel including a photodiode vertical doping profile adapted to improve sensitivity to infrared radiation.

FIG. 2 illustrates a cross-sectional view of a conventional image sensor pixel 200 of a CIS including a photosensitive element doping structure that may be optimized for sensitivity in the infrared range. Such a sensor cell 200 may effectively be applied to more demanding imaging applications such as in the security and automotive industries. The CIS includes an array of pixels 200 disposed in a substrate. An individual image sensor pixel includes a photosensitive element 215, a photosensitive element deep extension 216 and a floating diffusion region 255. A transfer gate, which is shown as poly gate 205 in FIG. 2, with a gate oxide 207 having a uniform thickness is disposed between the photosensitive element 215 and the floating diffusion FD region 255. The floating diffusion 255 may be contained within a P type well 240 that extends underneath the poly gate 205. A conducting channel 275 may be formed under poly gate 205, when a bias voltage is applied to it. The bias voltage at which the channel forms may be called the Gate Threshold Voltage (Vt). Epitaxial layer 204 may be any suitable semiconductor material, such as P type doped silicon. The gate oxide 207 is silicon dioxide. Poly gate 205 may be polysilicon. STI 230 may be any suitable insulating material capable of preventing leakage of electrical signals between components on epitaxial layer 204. A P-type pinning region 235 covers the pixel photosensitive area extending to the STI 230 insulating boundaries and the edge of the transfer poly gate 205 electrode.

The n-type deep photosensitive region may be formed by implanting phosphorus to a dose of $3 \times 10^{12}$ cm$^{-2}$ with an energy of up to 1 MeV or alternately several implants at energies from 200 keV to 1 MeV each.

The image sensor pixel 200 shown in FIG. 2 operates in a somewhat similar manner to sensor cell 100. One factor that may impact the complete transfer of carriers is the overlap of the regions of photosensitive element 215 and photosensitive element deep extension 216. If the overlap between photosensitive element 215 and photosensitive element deep extension 216 is insufficient, an energy barrier may be created that impedes the transfer of signal carriers from photosensitive element deep extension 216 into photosensitive element 215 and through the poly gate 205 to floating diffusion FD 355. The result is image lag.

Even with the proper placement of photosensitive element deep extension 216 with respect to its overlap of photosensitive element 215, another factor impacting the complete transfer of carriers in large implementations of photosensitive element 215 is associated with the spacing 218 between the center of the photosensitive element 215 and the edge of the transfer transistor gate, poly gate 205. In a photosensitive element 215 that has been uniformly doped over its planar dimensions and in which the vertical regions of photosensitive element 215 and photosensitive element deep extension 216 are properly overlapped, the point of highest potential, which is illustrated as Vpin 219 in FIG. 2, after the reset step is located at the center area of the photosensitive element as shown. With the Vpin 219 point located at the center of the photosensitive area, signal carriers of large area pixels are less likely to be emptied out completely from the photosensitive element 215 during a transfer operation.

Figure 3:
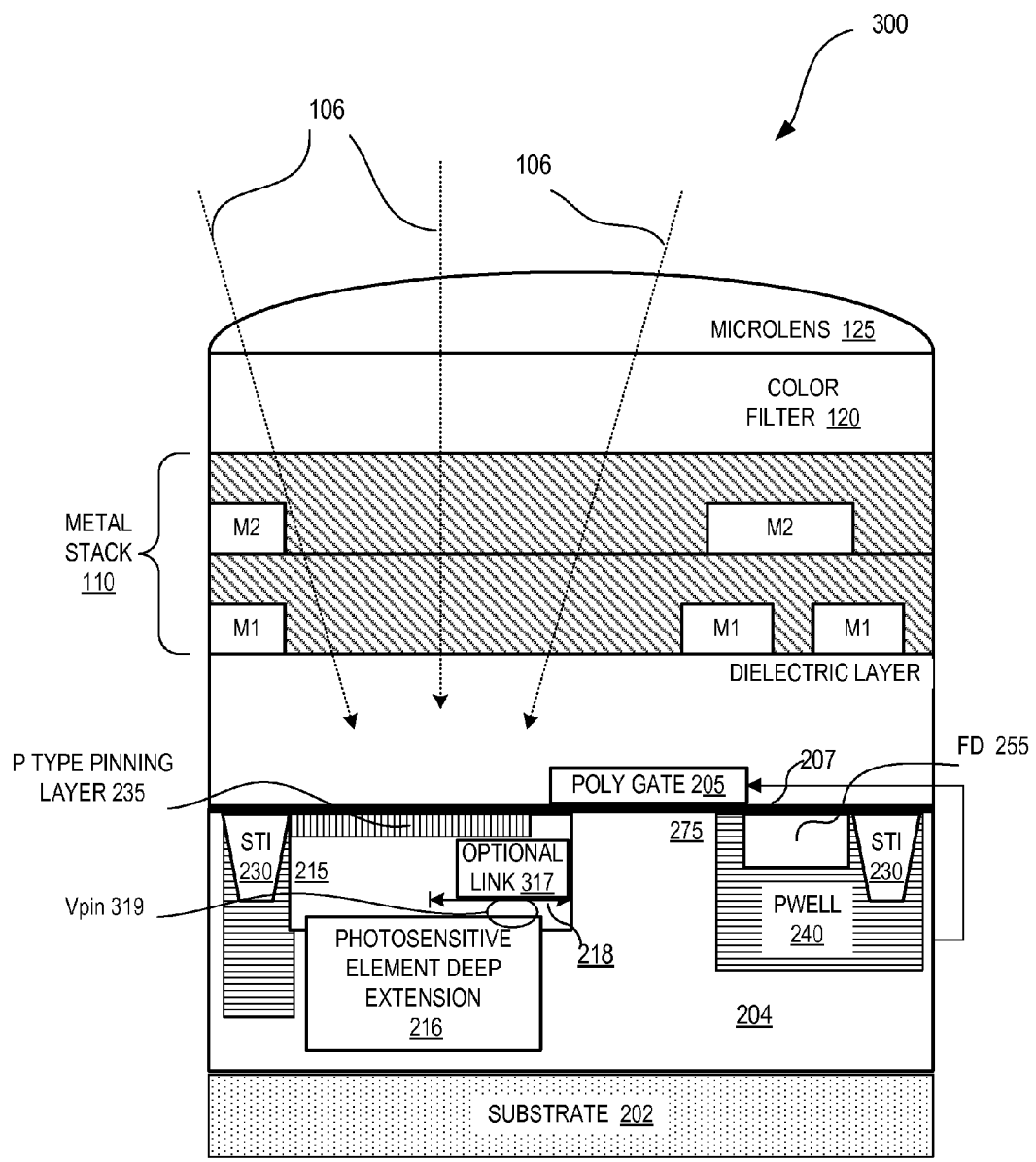
FIG. 3 is a cross-sectional view of one example of an image sensor pixel in accordance with the teachings of the present invention.

FIG. 3 illustrates a cross-sectional view of an image sensor pixel 300 of a CIS including a photosensitive element doping structure in accordance with the teachings of the present invention. As shown in the depicted example, pixel 300 of FIG. 3 shares similarities with pixel 100 of FIG. 1 and pixel 200 of FIG. 2, and like regions have kept their former labels. In one example, one difference is that pixel 300 of FIG. 3 includes the addition of an optional link region 317, which is of the same doping type as photosensitive element 215 and photosensitive element deep extension 216 and is placed near the transfer poly gate 205 both laterally with respect to the center of the photosensitive element 215 and vertically with respect to the depth of the photosensitive element deep extension 216. In one example, optional link region 317 extends under poly gate 205 as shown. In another example, optional link region 317 is not included. As will be discussed in greater detail with regard to the example illustrated in FIG. 4 below, the photosensitive element 215 and the deep extension 216 are stacked in the semiconductor material 204 in a "U" shape extending from under the transfer gate 205. In an example that includes optional link region 317, photosensitive element 215, photosensitive element deep extension 216 and link region 317 are of n-type doping material. The inclusion of this link region 317 effectively relocates the point of highest potential Vpin 319 point away from the center of the photosensitive element 215 area and places it nearer the edge of poly gate 205 as shown in FIG. 3. In other words, the point of highest potential Vpin 319 after a reset is located between the center of the photosensitive element 215 and the transfer gate 205 in accordance with the teachings of the present invention. This combination of photosensitive element deep extension 216 and photosensitive element 215 with the addition of link region 317 results in improved full well capacity and reduced image lag.

Figure 4:
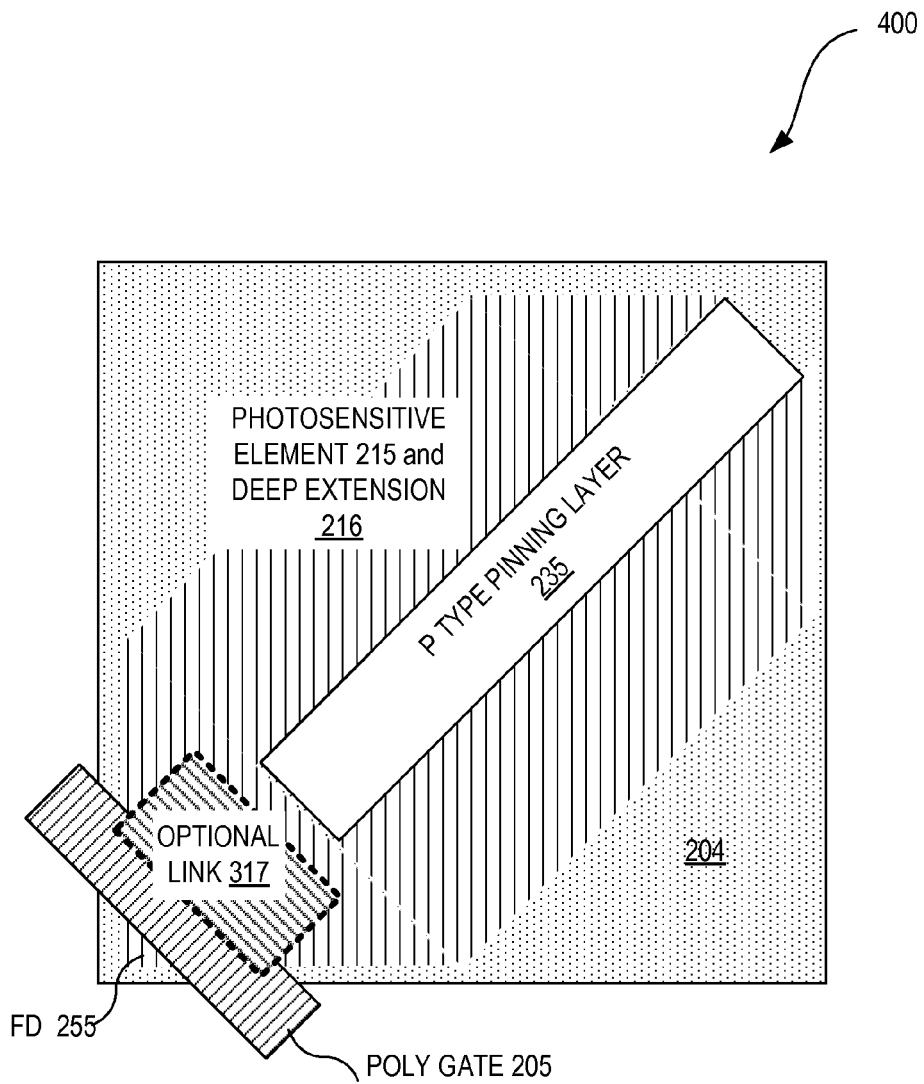
FIG. 4 shows a layout view of one example of an image sensor pixel in accordance with the teachings of the present invention.

FIG. 4 shows a layout of certain pixel circuit elements in a pixel cell 400 in accordance with the teachings of the present invention. It is appreciated that in the depicted example, pixel 400 of FIG. 4 shares similarities with pixel 300 of FIG. 3, and like regions have kept their former labels. For instance, as illustrated in the depicted example, pixel cell 400 includes a combination of a stacked photosensitive element deep extension 216 and a shallow photosensitive element 215 disposed in semiconductor material 204 and extending from the poly gate 205 electrode as shown. In one example, optional link region 317 is not included in pixel 400. In another example as depicted in FIG. 4, optional link region 317 may be included in pixel 400 as shown. As illustrated in the depicted example, a floating diffusion FD 255 disposed on the opposite side of poly gate 205 from the stacked photosensitive element deep extension 216 and shallow photosensitive element 215. In the example shown in FIG. 4, the stacked photosensitive element deep extension 216 and shallow photosensitive element 215 are in the shape of a "U" extending from under the transfer gate 205. As a result, the highest Vpin point 218, is following the shape change of photosensitive element 215 and deep extension 216, and moves closer to the transfer gate 205. In one example, the central region of the "U" shape includes only a p-type pinning layer 235 over the substrate. This doesn't affect quantum efficiency because the charge generated by incident light is driven into the photosensitive element 215 by the electric field. Full well capacity, on the other hand, can be compensated by adjusting the implant dose of photosensitive element 215. In the example, the absence of n-type doping in the central region of the "U" shape provides an additional measure to prevent the Vpin point from occurring in the central region of the pixel. Instead, the point of highest potential Vpin location, as also discussed above in FIG. 3, is away from the center of the photosensitive element 215 area towards the edge of poly gate 205. This combination of photosensitive element deep extension 216 and photosensitive element 215, with or without the addition of optional link region 317, results in improved full well capacity and reduced image lag in accordance with the teachings of the present invention.

Figure 5:
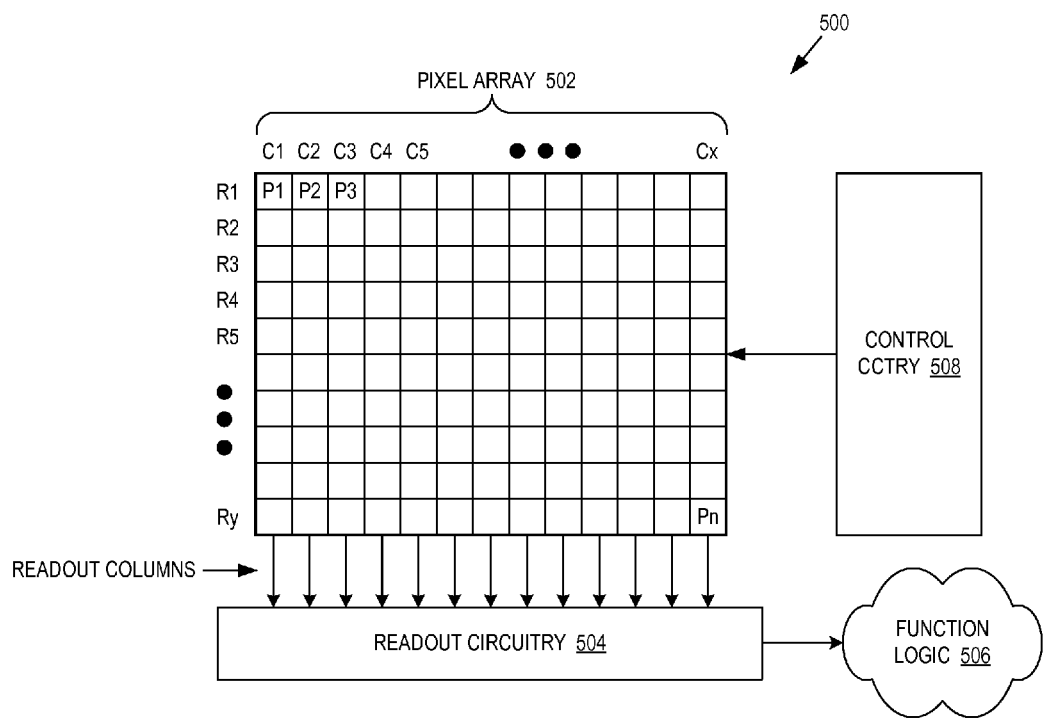
FIG. 5 is a diagram illustrating one example of an imaging system including a pixel array having image sensor pixels in accordance with the teachings of the present invention.

FIG. 5 is a diagram illustrating one example of an imaging system 500 including an example pixel array 502 having a plurality of image sensor pixels in accordance with the teachings of the present invention. As shown in the depicted example, imaging system 500 includes pixel array 502 coupled to control circuitry 508 and readout circuitry 504, which is coupled to function logic 506.

In one example, pixel array 502 is a two-dimensional (2D) array of image sensor pixels (e.g., pixels P1, P2 . . . Pn). In one example, each image sensor pixel P1, P2 . . . Pn is substantially similar to image sensor pixel 300 of FIG. 3 or image sensor pixel 400 of FIG. 4 and therefore has optimized full well capacity and minimized image lag in accordance with the teachings of the present invention. As illustrated, each pixel is arranged into a row (e.g., rows R1 to Ry) and a column (e.g., column C1 to Cx) to acquire image data of a person, place, object, etc., which can then be used to render a 2D image of the person, place, object, etc.

In one example, after each pixel has acquired its image data or image charge, the image data is readout by readout circuitry 504 and then transferred to function logic 506. In various examples, readout circuitry 504 may include amplification circuitry, analog-to-digital (ADC) conversion circuitry, or otherwise. Function logic 506 may simply store the image data or even manipulate the image data by applying post image effects (e.g., crop, rotate, remove red eye, adjust brightness, adjust contrast, or otherwise). In one example, readout circuitry 504 may readout a row of image data at a time along readout column lines (illustrated) or may readout the image data using a variety of other techniques (not illustrated), such as a serial readout or a full parallel readout of all pixels simultaneously.

In one example, control circuitry 508 is coupled to pixel array 502 to control operational characteristics of pixel array 502. For example, control circuitry 508 may generate a shutter signal for controlling image acquisition. In one example, the shutter signal is a global shutter signal for simultaneously enabling all pixels within pixel array 502 to simultaneously capture their respective image data during a single acquisition window. In another example, the shutter signal is a rolling shutter signal such that each row, column, or group of pixels is sequentially enabled during consecutive acquisition windows.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

What is claimed is:

1. An image sensor pixel, comprising:
a photosensitive element having a first doping type disposed in semiconductor material;
a deep extension having the first doping type disposed beneath and overlapping the photosensitive element in the semiconductor material;
a floating diffusion disposed in the semiconductor material; and
a transfer gate disposed over a gate oxide disposed over the semiconductor material between the photosensitive element and the floating diffusion, wherein the photosensitive element and the deep extension are stacked in the semiconductor material in a "U" shape extending from under the transfer gate.

2. The image sensor pixel wherein a point of highest potential in the photosensitive element after a reset is located between the center of the photosensitive element and the transfer gate.

3. The image sensor pixel of claim 1 wherein the semiconductor material is included in an epitaxial layer of the image sensor pixel.

4. The image sensor pixel of claim 1 wherein floating diffusion is disposed in well region disposed in the semiconductor material.

5. The image sensor pixel of claim 1 further comprising a link region having the first doping type disposed in the photosensitive element proximate to the transfer gate laterally with respect to a center of the photosensitive element and vertically with respect to a depth of the deep extension.

6. The image sensor pixel of claim 5 wherein the link region extends under the transfer gate.

7. The image sensor pixel of claim 1 further comprising a pinning surface layer having a second doping type disposed over the semiconductor material in a central region of the "U" shape.

8. The image sensor pixel of claim 7 wherein the pinning surface layer extends to an insulating region and an edge of the transfer gate.

9. The image sensor pixel of claim 1 further comprising:
a dielectric layer disposed over the gate oxide and the poly gate;
a metal stack layer disposed over the dielectric layer; and
a lens disposed over the metal stack layer, wherein light is directed along an optical path through the lens to the photosensitive element.

10. The image sensor pixel of claim 9 further comprising a color filter disposed along the optical path.

11. An imaging system, comprising:
a pixel array having a plurality of image sensor pixels, wherein each one of the plurality of image sensor pixels includes:
a photosensitive element having a first doping type disposed in semiconductor material;
a deep extension having the first doping type disposed beneath and overlapping the photosensitive element in the semiconductor material;
a floating diffusion disposed in the semiconductor material; and
a transfer gate disposed over a gate oxide disposed over the semiconductor material between the photosensitive element and the floating diffusion, wherein the photosensitive element and the deep extension are stacked in the semiconductor material in a "U" shape extending from under the transfer gate;
control circuitry coupled to the pixel array to control operation of the pixel array; and
readout circuitry coupled to the pixel array to readout image data from the plurality of image sensor pixels.

12. The imaging system of claim 11 further comprising function logic coupled to the readout circuitry to store the image data readout from the plurality of image sensor pixels.

13. The imaging system of claim 11 wherein a point of highest potential in the photosensitive element after a reset is located between the center of the photosensitive element and the transfer gate.

14. The imaging system of claim 11 wherein the semiconductor material is included in an epitaxial layer of each one of the plurality of image sensor pixels.

15. The imaging system of claim 11 wherein floating diffusion is disposed in well region disposed in the semiconductor material.

16. The imaging system of claim 11 further comprising a link region having the first doping type disposed in the photosensitive element proximate to the transfer gate laterally with respect to a center of the photosensitive element and vertically with respect to a depth of the deep extension.

17. The imaging system of claim 16 wherein the link region extends under the transfer gate.

18. The imaging system of claim 11 further comprising a pinning surface layer having a second doping type disposed over the semiconductor material in a central region of the "U" shape.

19. The imaging system of claim 18 wherein the pinning surface layer extends to an insulating region and an edge of the transfer gate.

20. The imaging system of claim 11 wherein each one of the plurality of image sensor pixels further comprises:
   a dielectric layer disposed over the gate oxide and the poly gate;
   a metal stack layer disposed over the dielectric layer; and
   a lens disposed over the metal stack layer, wherein light is directed along an optical path through the lens to the photosensitive element.

21. The imaging system of claim 20 wherein each one of the plurality of image sensor pixels further comprises a color filter disposed along the optical path.

\* \* \* \* \*